(12) United States Patent
Fan et al.

(10) Patent No.: US 8,746,925 B2
(45) Date of Patent: Jun. 10, 2014

(54) CIRCUIT BOARD CIRCUIT APPARATUS AND LIGHT SOURCE APPARATUS

(75) Inventors: Hua-Chen Fan, Hsin-Chu (TW); Te-Hen Lo, Hsin-Chu (TW); Cheng-Wei Chang, Hsin-Chu (TW)

(73) Assignee: Au Optronics Corporation, Hsin-Chu (TW)

( * ) Notice: Subject to any disclaimer, the term of this patent is extended or adjusted under 35 U.S.C. 154(b) by 151 days.

(21) Appl. No.: 13/600,352

(22) Filed: Aug. 31, 2012

(65) Prior Publication Data

US 2013/0120993 A1    May 16, 2013

(30) Foreign Application Priority Data

Nov. 11, 2011  (TW) .............................. 100141229 A

(51) Int. Cl.
*F21V 21/00*  (2006.01)
(52) U.S. Cl.
USPC ......... 362/249.02; 362/612; 361/56; 174/255
(58) Field of Classification Search
USPC ................ 362/249.02, 249.01, 612; 174/255; 361/56
See application file for complete search history.

(56) References Cited

U.S. PATENT DOCUMENTS

| 8,516,693 B2 * | 8/2013 | Chang ............................ 29/841 |
| 2012/0057358 A1 | 3/2012 | Wu et al. |
| 2012/0160803 A1 * | 6/2012 | Cai ................................ 216/20 |

FOREIGN PATENT DOCUMENTS

| TW | I229577 | 3/2005 |
| TW | 200813559 | 3/2008 |

OTHER PUBLICATIONS

English translation of abstract of TW 200813559.
English translation of abstract of TW I229577.

\* cited by examiner

*Primary Examiner* — Ali Alavi
(74) *Attorney, Agent, or Firm* — McClure, Qualey & Rodack, LLP

(57) ABSTRACT

A circuit board circuit apparatus and a light source apparatus including a substrate, a circuit layer, and at least one electronic component are disclosed. The circuit layer is formed on a surface of the substrate. The circuit layer includes a first circuit and a second circuit which are coplanar-disposed. The at least one electronic component is disposed on the circuit layer and connected with the circuit layer. Each electronic component has a first contact and a second contact. At least a part of the second circuit is disposed between the at least one electronic component and the first circuit. The at least one electronic component crosses over the second circuit, so that the second circuit penetrates through the bottom of the electronic component between the first contact and the second contact.

29 Claims, 5 Drawing Sheets

US 8,746,925 B2

CIRCUIT BOARD CIRCUIT APPARATUS AND LIGHT SOURCE APPARATUS

BACKGROUND OF THE INVENTION

1. Field of the Invention

The invention relates to a circuit board circuit and a light source apparatus; in particular, to the circuit board circuit apparatus and the light source apparatus using a structure of single-layer board.

2. Description of the Prior Art

In recent years, with the continuous progress of display technology, the liquid crystal display is mass produced and widely used. It is no doubt that the liquid crystal display has become the mainstream of the flat panel display technology.

In general, a backlight module is a very important part of the liquid crystal display, and a LED light bar used as the backlight source is an important component in the backlight module. As shown in FIG. 1, the LED light bar 1 includes a flexible circuit board 10, a circuit layer 12, and a plurality of electronic components 14A~14F. The circuit layer 12 of the LED light bar 1 includes positive voltage circuits V+, negative voltage circuits V−, and ground circuits GND. Because the routing of the circuits of the circuit layer 12 is complicated, if the routing is disposed on a single-layer board, the positive voltage circuits V+ and the ground circuits GND will intersect at P1~P3 and become short. Therefore, the current flexible circuit board 10 of the LED light bar 1 usually uses a routing of two-layer board copper foil to overcome the above-mentioned circuit short problem.

However, the drawbacks of the routing of two-layer board copper foil used in the flexible circuit board of the current LED light bar is that the routing of two-layer board copper foil not only increases the material cost and the overall manufacturing cost of the backlight module, but also makes the flexible circuit board become hard to bend and lose its good flexibility.

SUMMARY OF THE INVENTION

Therefore, the invention provides a circuit board circuit apparatus and a light source apparatus to solve the above-mentioned problems occurred in the prior arts.

An embodiment of the invention is a circuit board circuit apparatus. In this embodiment, the circuit board circuit apparatus includes a substrate, a circuit layer, and at least one electronic component. The circuit layer is formed on a surface of the substrate. The circuit layer includes a first circuit and a second circuit which are coplanar-disposed. The at least one electronic component is disposed on the circuit layer and connected with the circuit layer. Each electronic component has a first contact and a second contact. At least a part of the second circuit is disposed between the at least one electronic component and the first circuit. The at least one electronic component crosses over the second circuit, so that the second circuit penetrates through the bottom of the electronic component between the first contact and the second contact.

In an embodiment, a first channel region is formed between at least a part of the first circuit and a first side of the at least one electronic component, the second circuit passes the first channel region in and out from a second side of the electronic component opposite to the first side by passing under the electronic component forming the first channel region.

In an embodiment, the second circuit passes the first channel region in and out from the second side of the electronic component by passing between the two adjacent electronic components forming the first channel region.

In an embodiment, the first circuit connects with the first contact of the electronic component forming the first channel region to form a closed end of the first channel region.

In an embodiment, the first circuit connects with the first contact of another electronic component forming the first channel region to form another closed end of the first channel region, two ends of the second circuit passes the first channel region in and out by passing under the electronic component or passing between the two adjacent electronic components.

In an embodiment, the circuit board circuit apparatus further includes a third circuit. A second channel region is formed between at least a part of the first circuit and the second side of the at least one electronic component. The second circuit passes the second channel region in and out from the first channel region by passing under the electronic component forming the second channel region.

In an embodiment, the first circuit is connected with the first contact of the electronic component across the second circuit.

In an embodiment, the electronic components are connected in series by the circuit layer to form a series set, and the second circuit passes under at least one electronic component of the series set.

In an embodiment, the second circuit passes between the two adjacent series sets.

In an embodiment, one of the first circuit and the second circuit is a ground circuit.

In an embodiment, the ground circuit includes at least one electromagnetic protective pad exposed to air and disposed next to the electronic component.

In an embodiment, the ground circuit passes between the adjacent electronic components, and the electromagnetic protective pad is disposed between the adjacent electronic components.

In an embodiment, the at least one electronic component includes a plurality of light emitting components aligned in a line and distributed along a connection direction between the first contact and the second contact, the ground circuit includes a ground buffer block located at an end of the line aligned by the plurality of light emitting components.

In an embodiment, the at least one electronic component includes a first light emitting component and a second light emitting component disposed in interval, an angle is formed between a connection between the first contact and the second contact of the first light emitting component and the second light emitting component and a connection between the first light emitting component and the second light emitting component, the ground circuit includes a ground buffer block located between the first light emitting component and the second light emitting component.

In an embodiment, the circuit board circuit apparatus further includes a third circuit. The second circuit passes under the electronic component to enter between the first circuit and the third circuit.

Another embodiment of the invention is a light source apparatus. In this embodiment, the light source apparatus includes a substrate, a circuit layer, and a plurality of light emitting components. The circuit layer is formed on a surface of the substrate and includes a first circuit and a second circuit, and the first circuit and the second circuit are coplanar-disposed. The plurality of light emitting components is disposed on the circuit layer and connected with the circuit layer, and each light emitting component has a first contact and a second contact. At least a part of the first circuit is disposed at a first side of at least one the light emitting component crossing the second circuit, and the second circuit passes under the light emitting component between the first contact and the second contact from the first side to a second side of the light emitting component.

Compared to the prior art, the circuit board circuit apparatus and the light source apparatus of the invention use the pads located between the positive contact and the negative contact under the LED to route. Therefore, the flexible circuit board in the invention can route without the two-layer board structure, and the short caused by the interferences among different lines can be prevented. Because the single-layer board structure is used in the flexible circuit board of the LED light bar of the invention, not only the material cost of the flexible circuit board can be lowered about 20% to lower the entire manufacturing cost of the backlight module, but also the feature of easy to bend of the flexible circuit board can be maintained without abandoning the good flexibility of the flexible circuit board.

The advantage and spirit of the invention may be understood by the following detailed descriptions together with the appended drawings.

BRIEF DESCRIPTION OF THE APPENDED DRAWINGS

DETAILED DESCRIPTION OF THE INVENTION

A preferred embodiment of the invention is a circuit board circuit apparatus. In fact, the circuit board circuit apparatus is preferred a light source apparatus, but not limited to this. In this embodiment, the light source apparatus can include a LED light bar formed by LEDs and the light source apparatus is disposed in the backlight module of the liquid crystal display to provide the backlight source needed for the liquid crystal display, but not limited to this. Next, the circuit board circuit apparatus will be introduced in detail.

Figure 1:
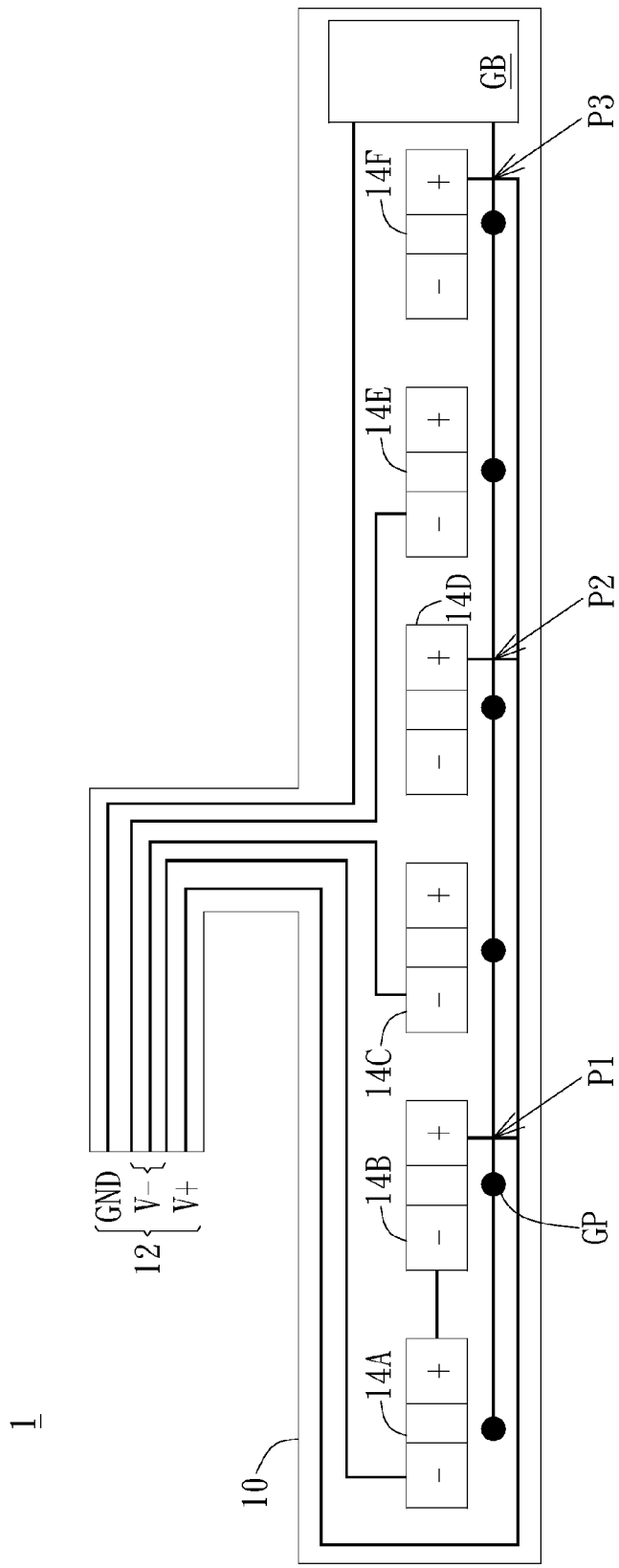
FIG. 1 illustrates a schematic diagram of the routing of the circuit board circuit apparatus in the prior art.
Figure 2:
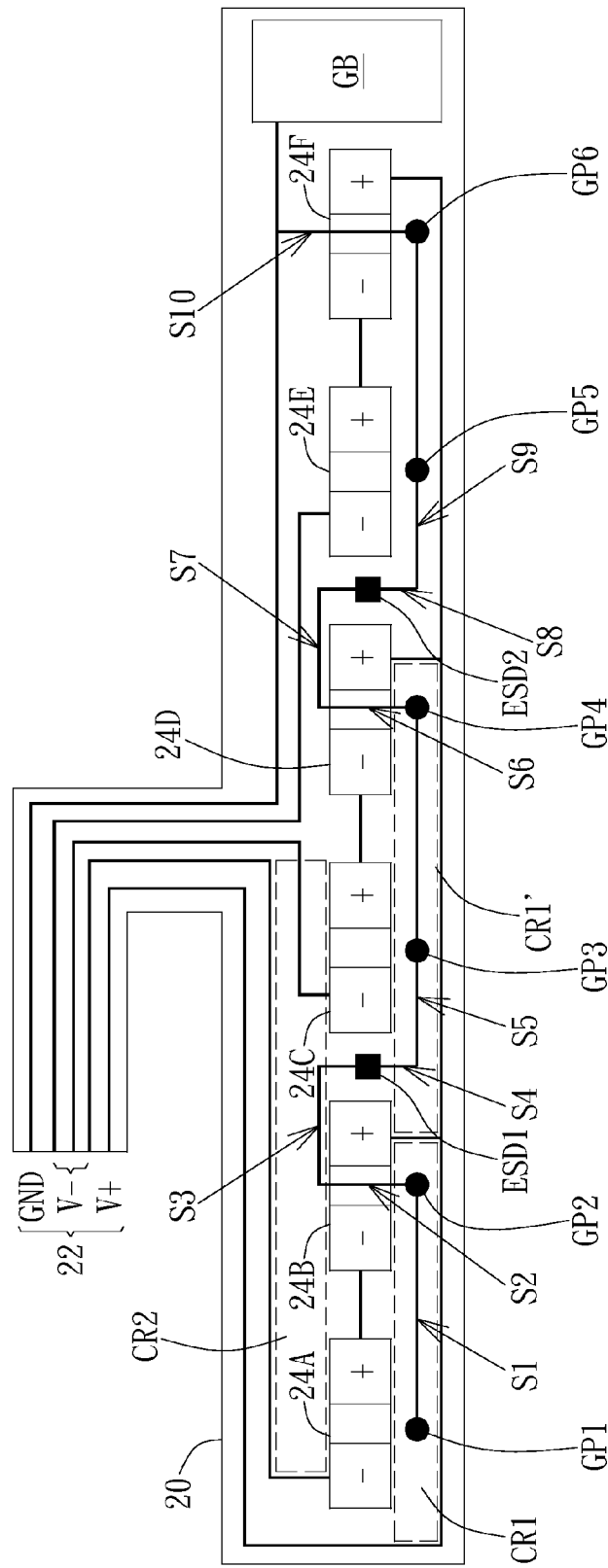
FIG. 2 illustrates a schematic diagram of the routing of the circuit board circuit apparatus in an embodiment of the invention.

Please refer to FIG. 2. FIG. 2 illustrates a schematic diagram of the routing of the circuit board circuit apparatus in this embodiment. As shown in FIG. 2, the circuit board circuit apparatus 2 includes a substrate 20, a circuit layer 22, and a plurality of electronic components 24A~24F. Wherein, the substrate 20 is a flexible circuit board that is easy to bend; the circuit layer 22 is formed on a surface of the substrate 20; the electronic components 24A~24F are disposed on the circuit layer 22 and connected with the circuit layer 22 respectively, and each of the electronic components 24A~24F has a first contact + and a second contact −. In fact, the electronic components 24A~24F can include a light emitting component, such as a LED, but not limited to this.

In this embodiment, the circuit layer 22 includes a first circuit, a second circuit, and a third circuit; the first circuit, the second circuit, and the third circuit are coplanar-disposed. For example, in this embodiment, the first circuit is a positive voltage circuit V+, the second circuit is a ground circuit GND, and the third circuit is a negative voltage circuit V−. Wherein, the ground circuit GND includes a plurality of electromagnetic protective pads ESD1 and ESD2 disposed near the electronic components. The electromagnetic protective pads ESD1 and ESD2 are disposed between two adjacent electronic components and exposed to air to avoid the electromagnetic interference generated between the two adjacent electronic components. The electronic components 24A~24F are aligned in a line, and distributed along a connection direction between the first contact + and the second contact −. The ground circuit GND includes ground pads GP1~GP6 and a ground buffer block GB, wherein the ground pads GP1~GP6 are disposed under the electronic components 24A~24F corresponding between the first contact + and the second contact − of the electronic components 24A~24F respectively; the ground buffer block GB is located at an end of the line alignment formed by the electronic components 24A~24F.

For example, because the ground circuit GND passes between the adjacent electronic components 24B and 24C, the electromagnetic protective pad ESD1 is disposed on the ground circuit GND between the electronic components 24B and 24C to avoid the electromagnetic interference generated between the two adjacent electronic components 24B and 24C. Similarly, because the ground circuit GND also passes between the adjacent electronic components 24D and 24E, the electromagnetic protective pad ESD2 is disposed on the ground circuit GND between the electronic components 24D and 24E to avoid the electromagnetic interference generated between the two adjacent electronic components 24D and 24E. Compared to the ground pads GP1~GP6, the electromagnetic protective pads ESD1 and ESD2 can electromagnetically protect the electronic components at two sides.

As shown in FIG. 2, a first channel region CR1 is formed between the positive voltage circuit V+ and the first side (bottom side) of the electronic components 24A and 24B, and a second channel region CR2 is formed between the negative voltage circuit V− and the second side (up side) of the electronic components 24A and 24B. The ground circuit GND in the first channel region CR1 passes under the electronic component 24B from the first side (bottom side) of the electronic component 24B, and enters into the second channel region CR2 from the second side (up side). The positive voltage circuit V+ and the first contact + of the electronic component 24B are connected with form a closed end of the first channel region CR1.

Similarly, a first channel region CR1' will be also formed between the positive voltage circuit V+ and the first side (bottom side) of the electronic components 24B, 24C, and 24D. The positive voltage circuit V+ connects with the first contact + of the electronic component 24B to form an end of the first channel region CR1'; the positive voltage circuit V+ connects with the first contact + of the electronic component 24D to form another end of the first channel region CR1'. The ground circuit GND in the second channel region CR2 passes between the two adjacent electronic components 24B and 24C to enter into the first channel region CR1'.

In the same way, another first channel region will be also formed between the positive voltage circuit V+ and the first side (bottom side) of the electronic components 24D, 24E, and 24F. Since its structure is similar to the above-mentioned structures, it is not described again here.

In this embodiment, the electronic components 24A and 24B, the electronic components 24C and 24D, and the electronic components 24E and 24F are respectively connected in series by the circuit layer 22 to form a first series set, a second series set, and a third series set. In the first series set, the first contact + of the electronic component 24A is connected with the second contact − of the electronic component 24B, and the negative voltage circuit V− is connected with the second contact − of the electronic component 24A and the positive voltage circuit V+ is connected with the first contact + of the electronic component 24B; in the second series set, the first contact + of the electronic component 24C is connected with the second contact − of the electronic component 24A, and the negative voltage circuit V− is connected with the second contact − of the electronic component 24C and the positive voltage circuit V+ is connected with the first contact + of the electronic component 24D. In the third series set, the first contact + of the electronic component 24E is connected with the second contact − of the electronic component 24F, and the negative voltage circuit V− is connected with the second contact − of the electronic component 24E and the positive voltage circuit V+ is connected with the first contact + of the electronic component 24F.

It should be noticed that each series set can include more electronic components as shown in the figures. In addition, the ground circuit GND not only passes under the electronic component 24B in the first series set, under the electronic component 24D in the second series set, and under the electronic component 24F in the third series set, but also passes between the adjacent electronic component 24B in the first series set and electronic component 24C in the second series set, and passes between the adjacent electronic component 24D in the second series set and electronic component 24E in the third series set.

Figure 3A:
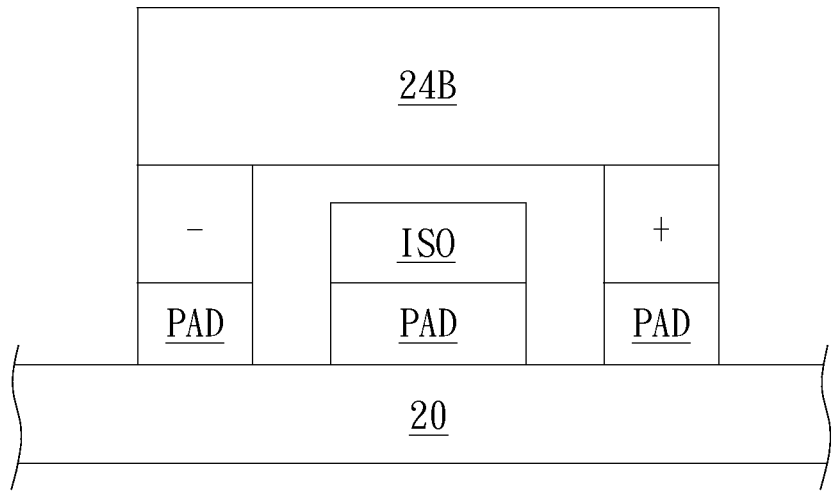
FIG. 3A illustrates a cross-sectional view of the electronic component and the circuit passing under the electronic component.
Figure 3B:
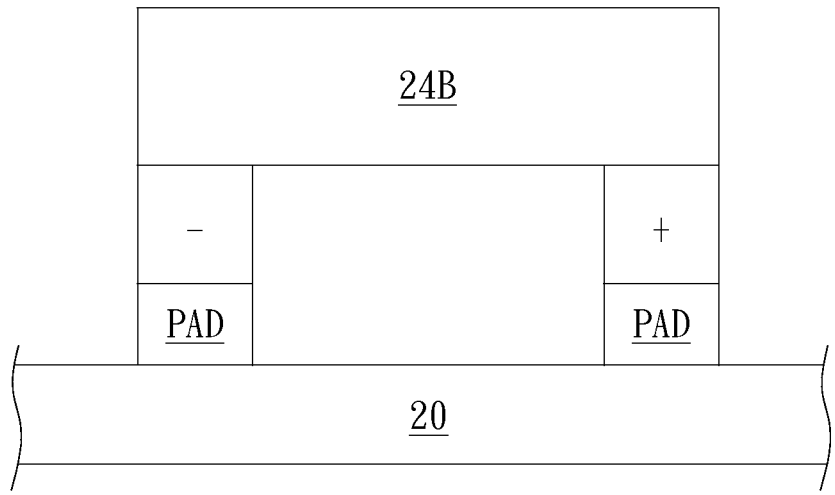
FIG. 3B illustrates a cross-sectional view of the electronic component without any circuit passing under the electronic component.

Please refer to FIG. 3A and FIG. 3B. FIG. 3A illustrates a cross-sectional view of the electronic component and the circuit passing under the electronic component (for example, the electronic components 24B, 24D, and 24F and the ground circuit GND passing under them shown in FIG. 2); FIG. 3B illustrates a cross-sectional view of the electronic component without any circuit passing under the electronic component (for example, the electronic components 24A, 24C, and 24E without any circuit passing under them). As shown in FIG. 3A and FIG. 3B, the ground circuit GND in FIG. 2 uses the pad PAD located between the first contact + and the second contact − of the electronic component 24B on the substrate 20 to route from the first side (bottom side) of the electronic component 24B to the second side (up side) of the electronic component 24B by passing under the electronic component 24B, and a dielectric layer ISO is disposed on the pad PAD.

In order to introduce the routing of the ground circuit GND, it is assumed that the ground circuit GND can include ten connected sections S1~S10 from left to right according to the routing of the ground circuit GND. Wherein, the first section S1 of the ground circuit GND is located between the first side (bottom side) of the electronic component 24A and the positive voltage circuit V+ and between the first side (bottom side) of the electronic component 24B and the positive voltage circuit V+. The electronic component 24B passes over the second section S2 of the ground circuit GND, so that the second section S2 of the ground circuit GND can pass under the electronic component 24B from the first side (bottom side) of the electronic component 24B to the second side (up side) of the electronic component 24B by passing between the first contact + and the second contact − of the electronic component 24B. The third section S3 of the ground circuit GND is located between the negative voltage circuit V− and the second side (up side) of the electronic component 24B. The fourth section S4 of the ground circuit GND passes between the two adjacent electronic components 24B and 24C, and an electromagnetic protective pad ESD1 is disposed on the fourth section S4 of the ground circuit GND.

Similarly, the fifth section S5 of the ground circuit GND is located between the first side (bottom side) of the electronic component 24C and the positive voltage circuit V+ and between the first side (bottom side) of the electronic component 24D and the positive voltage circuit V+. The electronic component 24D passes over the sixth section S6 of the ground circuit GND, so that the sixth section S6 of the ground circuit GND can pass under the electronic component 24D from the first side (bottom side) of the electronic component 24D to the second side (up side) of the electronic component 24D by passing between the first contact + and the second contact − of the electronic component 24D. The seventh section S7 of the ground circuit GND is located between the negative voltage circuit V− and the second side (up side) of the electronic component 24D. The eighth section S8 of the ground circuit GND passes between the two adjacent electronic components 24D and 24E, and an electromagnetic protective pad ESD2 is disposed on the eighth section S8 of the ground circuit GND.

The ninth section S9 of the ground circuit GND is located between the first side (bottom side) of the electronic component 24E and the positive voltage circuit V+ and between the first side (bottom side) of the electronic component 24F and the positive voltage circuit V+. The electronic component 24F passes over the tenth section S10 of the ground circuit GND, so that the tenth section S10 of the ground circuit GND can pass under the electronic component 24F from the first side (bottom side) of the electronic component 24F to the second side (up side) of the electronic component 24F by passing between the first contact + and the second contact − of the electronic component 24F and connect with the ground buffer block GB.

Figure 4:
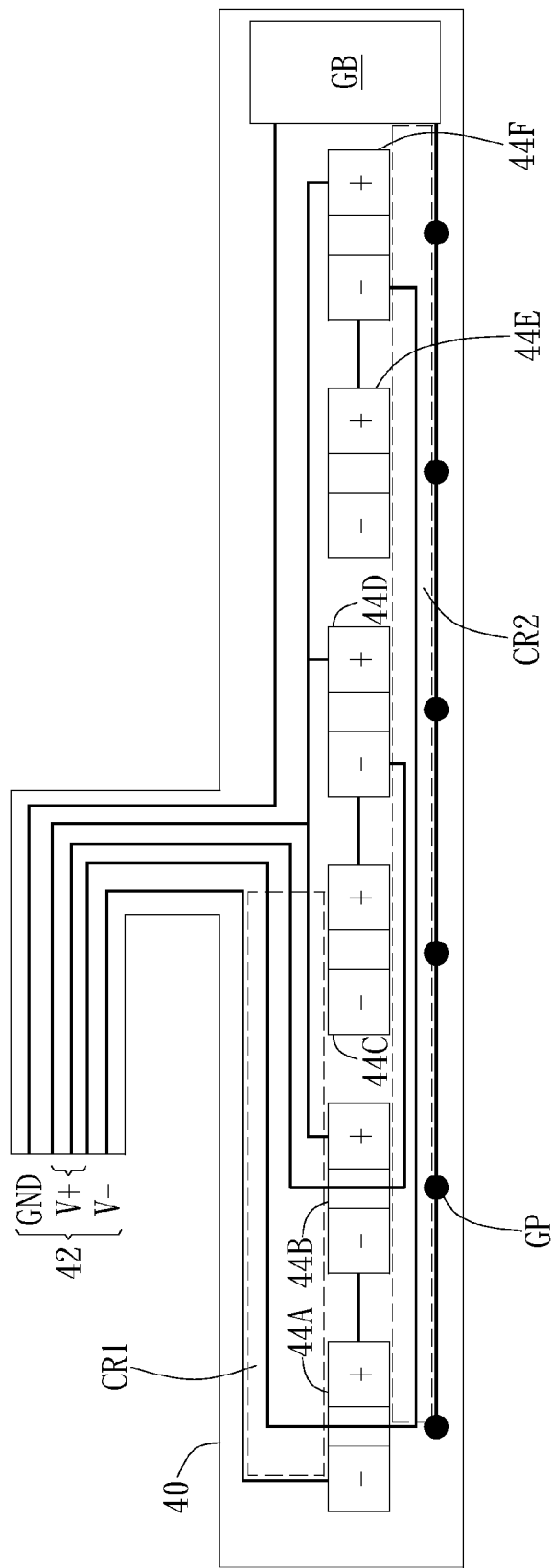
FIG. 4 illustrates a schematic diagram of the routing when the negative voltage circuit passing under the electronic component.

The above-mentioned embodiments describe the condition of the ground circuit GND passing under the electronic components. In fact, the circuit passing under the electronic components is not limited to the ground circuit GND, it can be also the positive voltage circuit V+ or the negative voltage circuit V− passing under the electronic components based on practical routing requirements. Please refer to FIG. 4. FIG. 4 illustrates a schematic diagram of the routing when the negative voltage circuit passing under the electronic component.

As shown in FIG. 4, the circuit board circuit apparatus 4 includes a substrate 40, a circuit layer 42, and a plurality of electronic components 44A~44F. Wherein, the substrate 40 is a flexible circuit board that is easy to bend; the circuit layer 42 is formed on a surface of the substrate 40; the electronic components 44A~44F are disposed on the circuit layer 42 and connected with the circuit layer 42 respectively, and each of the electronic components 44A~44F has a first contact + and a second contact −. In fact, the electronic components 44A~44F can include a light emitting component, such as a LED, but not limited to this.

In this embodiment, the circuit layer 42 includes a first circuit, a second circuit, and a third circuit; the first circuit, the second circuit, and the third circuit are coplanar-disposed. For example, in this embodiment, the first circuit is a negative voltage circuit V−, the second circuit is a positive voltage circuit V+, and the third circuit is a ground circuit GND. Wherein, the ground circuit GND is located under the electronic components 44A~44F, and includes a plurality of ground pads GD disposed near the electronic components. The electronic components 44A~44F are aligned in a line, and distributed along a connection direction between the first contact + and the second contact −. The ground circuit GND includes a ground buffer block GB, and the ground buffer block GB is located at an end of the line alignment formed by the electronic components 44A~44F.

As shown in FIG. 4, the negative voltage circuit V− is directly connected with the second contact − of the electronic component 44A. A first channel region CR1 is formed between the negative voltage circuit V− and the second side (up side) of the electronic components 44A~44C, and a second channel region CR2 is formed between the ground circuit GND and the first side (bottom side) of the electronic components 44A~44F. The positive voltage circuit V+ passes under the electronic component 44A between the first contact + and the second contact − of the electronic component 44A through the first channel region CR1, and then passes through the second channel region CR2 to connect with the second contact − of the electronic component 44F. The positive voltage circuit V+ will also pass under the electronic component 44B between the first contact + and the second contact − of the electronic component 44B through the first channel region CR1, and then passes through the second channel region CR2 to connect with the second contact − of the electronic component 44D.

The positive voltage circuit V+ is located at the second side (up side) of the electronic components 44A~44F opposite to the first side (bottom side), and the positive voltage circuit V+ is connected with the first contacts + of the electronic components 44B, 44D, and 44E. The first contact + of the electronic component 44A is connected with the second contact − of the electronic component 44B in series; the first contact + of the electronic component 44C is connected with the second contact − of the electronic component 44D in series; first contact + of the electronic component 44E is connected with the second contact − of the electronic component 44F in series.

Figure 5:
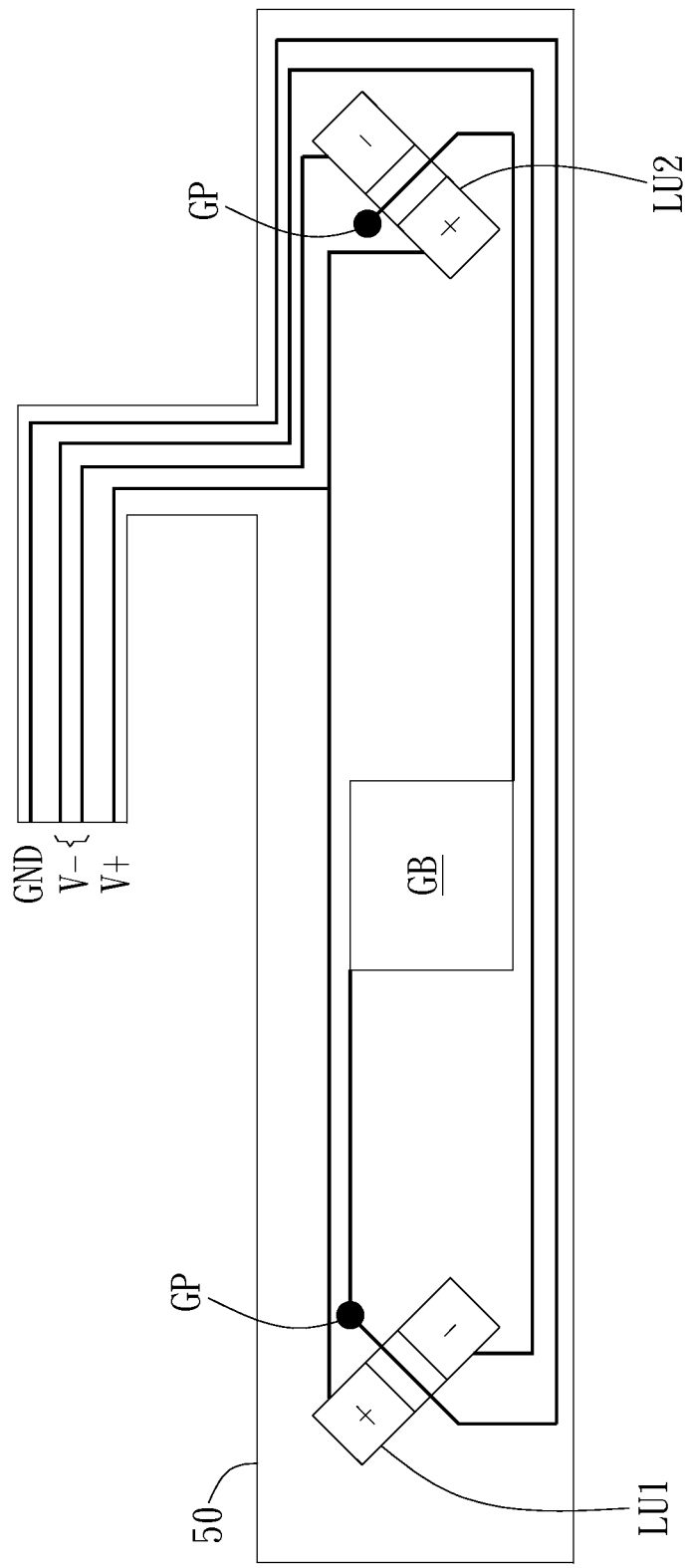
FIG. 5 illustrates a schematic diagram of the routing that the ground circuit passes under the light emitting component when the light emitting component uses the corner lighting alignment.

The electronic components (light emitting components) in the above-mentioned embodiments are aligned in a line, and distributed along the connection direction between the first contact + and the second contact − of the electronic components. In fact, the electronic components can be also aligned in other aligning ways based on different requirements. Please refer to FIG. 5. FIG. 5 illustrates a schematic diagram of the routing that the ground circuit passes under the light emitting component when the light emitting component uses the corner lighting alignment. As shown in FIG. 5, the coplanar-disposed first circuit, second circuit, and third circuit are a negative voltage circuit V−, a ground circuit GND, and a positive voltage circuit V+ respectively. A first light emitting component LU1 and a second light emitting component LU2 are disposed in interval at the left side and the right side of the substrate 50, and the first light emitting component LU1 and the second light emitting component LU2 have a first contact + and a second contact − respectively. A ground buffer block GB of the ground circuit GND is disposed between the first light emitting component LU1 and the second light emitting component LU2. At least one part of the negative voltage circuit V− is located at the first side (bottom side) of the second light emitting component LU2, and the second light emitting component LU2 passes over the ground circuit GND, so that the ground circuit GND passes under the second light emitting component LU2 between the first contact + and the second contact − from the first side (bottom side) of the second light emitting component LU2 to the second side (up side) of the second light emitting component LU2. An angle is formed between a connection between the first contact + and the second contact − of the first light emitting component LU1 and the second light emitting component LU2 and a connection between the first light emitting component LU1 and the second light emitting component LU2 respectively. In fact, the size of the angle can be changed based on practical conditions without any specific limitations.

In this embodiment, the ground circuit GND extending leftward from the ground buffer block GB will pass under the first light emitting component LU1 between the first contact + and the second contact − of the first light emitting component LU1; the ground circuit GND extending rightward from the ground buffer block GB will pass under the second light emitting component LU2 between the first contact + and the second contact − of the second light emitting component LU2. The positive voltage circuit V+ is connected with the first contacts + of the first light emitting component LU1 and the second light emitting component LU2 respectively; the negative voltage circuit V− is connected with the second contact − of the first light emitting component LU1 and the second light emitting component LU2 respectively. In addition, as shown in FIG. 5, the ground circuit GND enters between the positive voltage circuit V+ and the negative voltage circuit V− by passing under the first light emitting component LU1, and then the ground circuit GND is connected with a ground pad GP. The ground circuit GND extending rightward from the ground buffer block GB will also enter between the positive voltage circuit V+ and the negative voltage circuit V− by passing under the second light emitting component LU2, and then the ground circuit GND is connected with another ground pad GP.

In fact, the circuit passing under the light emitting components LU1 and LU2 is not limited to the above-mentioned ground circuit GND, it can be also the positive voltage circuit V+ or the negative voltage circuit V− passing under the electronic components based on practical routing requirements.

Compared to the prior art, the circuit board circuit apparatus and the light source apparatus of the invention use the pads located between the positive contact and the negative contact under the LED to route. Therefore, the flexible circuit board in the invention can route without the two-layer board structure, and the short caused by the interferences among different lines can be prevented. Because the single-layer board structure is used in the flexible circuit board of the LED light bar of the invention, not only the material cost of the flexible circuit board can be lowered about 20% to lower the entire manufacturing cost of the backlight module, but also the feature of easy to bend of the flexible circuit board can be maintained without abandoning the good flexibility of the flexible circuit board.

With the example and explanations above, the features and spirits of the invention will be hopefully well described. Those skilled in the art will readily observe that numerous modifications and alterations of the device may be made while retaining the teaching of the invention. Accordingly, the above disclosure should be construed as limited only by the metes and bounds of the appended claims.

What is claimed is:
1. A circuit board circuit apparatus, comprising:
a substrate;
a circuit layer, formed on a surface of the substrate, comprising a first circuit and a second circuit and the first circuit and the second circuit being coplanar-disposed; and
at least one electronic component, disposed on the circuit layer and connected with the circuit layer and each electronic component having a first contact and a second contact;
wherein at least a part of the second circuit is disposed between the at least one electronic component and the first circuit, the at least one electronic component crosses over the second circuit, so that the second circuit penetrates through the bottom of the electronic component between the first contact and the second contact.

2. The circuit board circuit apparatus of claim 1, wherein a first channel region is formed between at least a part of the first circuit and a first side of the at least one electronic component, the second circuit passes the first channel region in and out from a second side of the electronic component opposite to the first side by passing under the electronic component forming the first channel region.

3. The circuit board circuit apparatus of claim 2, wherein the second circuit passes the first channel region in and out from the second side of the electronic component by passing between the two adjacent electronic components forming the first channel region.

4. The circuit board circuit apparatus of claim 2, wherein the first circuit connects with the first contact of the electronic component forming the first channel region to form a closed end of the first channel region.

5. The circuit board circuit apparatus of claim 4, wherein the first circuit connects with the first contact of another electronic component forming the first channel region to form another closed end of the first channel region, two ends of the second circuit passes the first channel region in and out by passing under the electronic component or passing between the two adjacent electronic components.

6. The circuit board circuit apparatus of claim 2, further comprising a third circuit, wherein a second channel region is formed between at least a part of the first circuit and the second side of the at least one electronic component, the second circuit passes the second channel region in and out from the first channel region by passing under the electronic component forming the second channel region.

7. The circuit board circuit apparatus of claim 1, wherein the first circuit is connected with the first contact of the electronic component across the second circuit.

8. The circuit board circuit apparatus of claim 1, wherein the electronic components are connected in series by the circuit layer to form a series set, and the second circuit passes under at least one electronic component of the series set.

9. The circuit board circuit apparatus of claim 8, wherein the second circuit passes between the two adjacent series sets.

10. The circuit board circuit apparatus of claim 1, wherein one of the first circuit and the second circuit is a ground circuit.

11. The circuit board circuit apparatus of claim 10, wherein the ground circuit comprises at least one electromagnetic protective pad exposed to air and disposed next to the electronic component.

12. The circuit board circuit apparatus of claim 11, wherein the ground circuit passes between the adjacent electronic components, and the electromagnetic protective pad is disposed between the adjacent electronic components.

13. The circuit board circuit apparatus of claim 10, wherein the at least one electronic component comprises a plurality of light emitting components aligned in a line and distributed along a connection direction between the first contact and the second contact, the ground circuit comprises a ground buffer block located at an end of the line aligned by the plurality of light emitting components.

14. The circuit board circuit apparatus of claim 10, wherein the at least one electronic component comprises a first light emitting component and a second light emitting component disposed in interval, an angle is formed between a connection between the first contact and the second contact of the first light emitting component and the second light emitting component and a connection between the first light emitting component and the second light emitting component, the ground circuit comprises a ground buffer block located between the first light emitting component and the second light emitting component.

15. The circuit board circuit apparatus of claim 1, further comprising a third circuit, wherein the second circuit passes under the electronic component to enter between the first circuit and the third circuit.

16. A light source apparatus, comprising:
a substrate;
a circuit layer, formed on a surface of the substrate, comprising a first circuit and a second circuit and the first circuit and the second circuit being coplanar-disposed; and
a plurality of light emitting components, disposed on the circuit layer and connected with the circuit layer, and each light emitting component having a first contact and a second contact;
wherein at least a part of the first circuit is disposed at a first side of at least one the light emitting component crossing the second circuit, and the second circuit passes under the light emitting component between the first contact and the second contact from the first side to a second side of the light emitting component.

17. The light source apparatus of claim 16, wherein the plurality of light emitting components is aligned in a line, a first channel region is formed between at least a part of the first circuit and the first side of the plurality of light emitting components, the second circuit passes the first channel region in and out from the second side of the light emitting component by passing under the light emitting component forming the first channel region.

18. The light source apparatus of claim 17, wherein the second circuit passes the first channel region in and out from the second side of the light emitting components by passing between the two adjacent light emitting components forming the first channel region.

19. The light source apparatus of claim 17, wherein the first circuit connects with the first contact of the light emitting component forming the first channel region to form a closed end of the first channel region.

20. The light source apparatus of claim 19, wherein the first circuit connects with the first contact of another light emitting component forming the first channel region to form another closed end of the first channel region, two ends of the second circuit passes the first channel region in and out by passing under the light emitting component or passing between the two adjacent light emitting components.

21. The light source apparatus of claim 17, further comprising a third circuit, wherein a second channel region is formed between at least a part of the third circuit and the second side of the plurality of light emitting components, the second circuit passes the second channel region in and out from the first channel region by passing under the light emitting component forming the second channel region.

22. The light source apparatus of claim 16, wherein the first circuit is connected with the first contact of the light emitting component across the second circuit.

23. The light source apparatus of claim 16, wherein the plurality of light emitting components is connected in series by the circuit layer to form a series set, and the second circuit passes under at least one light emitting component of the series set.

24. The light source apparatus of claim 23, wherein the second circuit passes between the two adjacent series sets.

25. The light source apparatus of claim 16, wherein one of the first circuit and the second circuit is a ground circuit.

26. The light source apparatus of claim 25, wherein the ground circuit comprises at least one electromagnetic protective pad exposed to air and disposed next to the light emitting component.

27. The light source apparatus of claim 26, wherein the ground circuit passes between the adjacent light emitting components, and the electromagnetic protective pad is disposed between the adjacent light emitting components.

28. The light source apparatus of claim 25, wherein the plurality of light emitting components comprises a first light emitting component and a second light emitting component disposed in interval, light emitting directions of the first light emitting component and the second light emitting component are crossed and an angle is formed between the light emitting directions and a connection between the first light emitting component and the second light emitting component, the ground circuit comprises a ground buffer block located between the first light emitting component and the second light emitting component.

29. The light source apparatus of claim 16, further comprising a third circuit, wherein the second circuit passes under the light emitting component to enter between the first circuit and the third circuit.

* * * * *